(12) United States Patent
Lesher et al.

(10) Patent No.: US 6,847,219 B1
(45) Date of Patent: Jan. 25, 2005

(54) PROBE STATION WITH LOW NOISE CHARACTERISTICS

(75) Inventors: Timothy Lesher, Portland, OR (US); Brad Miller, Portland, OR (US); Clarence E. Cowan, Newberg, OR (US); Michael Simmons, Colton, OR (US); Frank Gray, Beaverton, OR (US); Cynthia L. McDonald, Beaverton, OR (US)

(73) Assignee: Cascade Microtech, Inc., Beaverton, OR (US)

(*) Notice: Subject to any disclaimer, the term of this patent is extended or adjusted under 35 U.S.C. 154(b) by 0 days.

(21) Appl. No.: 10/666,219

(22) Filed: Sep. 18, 2003

Related U.S. Application Data

(60) Provisional application No. 60/424,986, filed on Nov. 8, 2002.

(51) Int. Cl.[7] .............................................. G01R 31/02
(52) U.S. Cl. ........................................ 324/754; 174/36
(58) Field of Search ................................ 324/754–755, 324/761–762; 174/36, 32–34, 35; 333/243; 439/275

(56) References Cited

U.S. PATENT DOCUMENTS

| | | | | |
|---|---|---|---|---|
| 2,812,502 A | * | 11/1957 | Doherty | 333/243 |
| 4,365,109 A | * | 12/1982 | O'Loughlin | 174/109 |
| 4,479,690 A | * | 10/1984 | Inouye et al. | 439/275 |
| 6,284,971 B1 | * | 9/2001 | Atalar et al. | 174/36 |

FOREIGN PATENT DOCUMENTS

| | | |
|---|---|---|
| EP | 0 505 981 B1 | 3/1992 |

OTHER PUBLICATIONS

Knauer, William, "Fixturing for Low–Current/Low–Voltage Parametric Testing," *Evaluation Engineering*, pp. 150–153, Nov. 1990.

* cited by examiner

*Primary Examiner*—Vinh P. Nguyen
(74) *Attorney, Agent, or Firm*—Chernoff, Vilhauer, McClung & Stenzel, LLP

(57) ABSTRACT

A cable includes an inner conductor, an inner dielectric, and a guard conductor, where the inner dielectric is between the inner conductor and the guard conductor. The cable also includes an outer dielectric, and a shield conductor, where the outer dielectric is between the guard conductor and the shield conductor. The cable further includes an additional layer of material between the outer dielectric and the shield conductor of suitable composition for reducing triboelectric current generation between the outer dielectric and the shield conductor to less than that which would occur were the outer dielectric and the shield conductor to directly adjoin each other.

12 Claims, 4 Drawing Sheets

PROBE STATION WITH LOW NOISE CHARACTERISTICS

This application claims the benefit of Provisional U.S. patent application Ser. No. 60/424,986 filed Nov. 8, 2002.

BACKGROUND OF THE INVENTION

The present invention relates to probe stations which are used for probing test devices, such as integrated circuits on a wafer, and, in particular, to probe stations that are suitable for use in measuring ultra-low currents.

Probe stations are designed to measure the characteristics of electrical devices such as silicon wafers. Probe stations typically include a chuck that supports the electrical device while it is being probed by needles or contacts on a membrane situated above the chuck. In order to provide a controlled environment to probe the electrical device, many of today's probe stations surround the chuck with an environmental enclosure so that temperature, humidity, etc. may be held within predetermined limits during testing. Environmental enclosures protect the device from spurious air currents that would otherwise affect measurements, and also facilitate thermal testing of electrical devices at other-than-ambient environmental conditions. Environmental conditions within the enclosure are principally controlled by a dry air ventilation system as well as a temperature element, usually located below the chuck, that heats or cools the electrical device being tested through thermal conduction.

Many probe stations also incorporate guarding and electromagnetic interference (EMI) shielding structures within or around the environmental enclosures in order to provide an electrically quiet environment, often essential during low noise or current testing where electrical noise from external electromagnetic sources can hinder accurate measurement of the electrical device's characteristics. Guarding and EMI shielding structures are well known and discussed extensively in technical literature. See, for example, an article by William Knauer entitled "Fixturing for Low Current/Low Voltage Parametric Testing" appearing in *Evaluation Engineering*, November, 1990, pages 150–153.

Probe stations incorporating EMI shielding structures will usually at least partially surround the test signal with a guard signal that closely approximates the test signal, thus inhibiting electromagnetic current leakage from the test signal path to its immediately surrounding environment Similarly, EMI shielding structures may include interconnecting a shield potential to the environmental enclosure surrounding much of the perimeter of the probe station. The environmental enclosure is typically connected to earth ground, instrumentation ground, or some other desired potential.

To provide guarding and shielding for systems of the type just described, existing probe stations may include a multi-stage chuck upon which the electrical device rests when being tested. The top stage of the chuck, which supports the electrical device, typically comprises a solid, electrically conductive metal plate through which the test signal may be routed. A middle stage and a bottom stage of the chuck similarly comprise solid electrically conductive plates through which a guard signal and a shield signal may be routed, respectively. In this fashion, an electrical device resting on such a multistage chuck may be both guarded and shielded from below.

FIG. 1 shows a generalized schematic of an existing probe station. A probe station 10 includes a chuck 12 that supports an electrical device 14 lo be probed by a probe apparatus 16 supported by a platen 18 located above the chuck 12. The chuck is fixedly and/or rigidly interconnected with a tub enclosure 20. The enclosure 20 may be conductive and electrically connected to a guard signal, shield signal, ground signal, or floating. The tub enclosure 20 at least partially surrounds the chuck 12, and hence the electrical device 14.

Multiple electrical devices contained on a silicon wafer may be successively positioned below the probe apparatus 16 for testing by moving the combination of the tub enclosure 20 and chuck 12 laterally. A positioner 22, typically located below the tub enclosure 20, may provide vertical, lateral and/or angular adjustments of the chuck 12. Because the chuck 12 does not move laterally with respect to the tub enclosure 20, the size of the tub enclosure 20 may closely surround the chuck 12, facilitating efficient control of the environment immediately surrounding the chuck 12.

FIG. 2 shows a generalized schematic of another probe station 11. Referring to FIG. 2, where numerals common with FIG. 1 represent similar elements that perform similar functions, the probe station 11 includes the chuck 12 that supports the electrical device 14 to be probed by the probe apparatus 16 that extends through an opening in the platen 18. Rather than enclosing the chuck 12 in the tub enclosure 20, an outer shield box 24 provides sufficient space for the chuck 12 to be moved laterally by the positioner 22. Because the chuck 12 may freely move within the outer shield box 24, a suspended member 26 electrically interconnected to a guard potential may be readily positioned above the chuck 12. The suspended guard member 26 defines an opening that is aligned with the opening defined by the platen 18 so that the probe apparatus 16 may extend through the guard member 26 to probe the electrical device 14. When connected to a guard signal substantially identical to the test signal provided to the probe apparatus 16, the suspended guard member 26 provides additional guarding for low noise tests. Such a design is exemplified by EP 0 505 981 B1, incorporated by reference herein. In addition, multiple boxes insulated from one another for a single probe station have been used to attempt to reduce the noise, with the inner box connected to instrument ground and the outer box connected to earth ground.

To provide a substantially closed environment, the outer shield box 24 includes a sliding plate assembly 28 that defines a portion of the lower perimeter of the shield box 24. The sliding plate assembly 28 comprises a number of overlapping plate members. Each plate member defines a central opening 30 through which the positioner 22 may extend. Each successively higher plate member is smaller in size and also defines a smaller opening 30 through which the positioner 22 extends. As shown in FIG. 2, the sliding plate assembly 28 is included to permit lateral movement of the positioner 22, and hence the chuck 12, while maintaining a substantially closed lower perimeter for the shield box 24.

A probe card for probing the device under test of the probe station typically includes a dielectric board as a base. A plurality of probing devices are mounted in radial arrangement about an opening in the board so that the probing elements of these devices, which may, for example, comprise slender conductive needles, terminate below the opening in a pattern suitable for probing the contact sites of the test device. The probing devices are individually connected to the respective channels of a test instrument by a plurality of interconnecting lines, where the portion of each line that extends between the corresponding probing device and the outer edge of the dielectric board may comprise an interconnecting cable or a conductive trace pattern formed directly on the board. In one conventional type of setup where the test devices are integrated circuits formed on a semiconductive wafer, the probe card is mounted by means of a supporting rig or test head above the wafer, and a support beneath the wafer moves the wafer so that each device thereon is consecutively brought into contact with the needles or probing elements of the probe card.

With particular regard to probe cards that are specially adapted for use in measuring ultra-low currents (down to the femtoamp region or lower), probe card designers have been concerned with developing techniques for eliminating or at least reducing the effects of leakage currents, which are unwanted currents that can flow into a particular cable or channel from surrounding cables or channels so as to distort the current measured in that particular cable or channel. For a given potential difference between two spaced apart conductors, the amount of leakage current that will flow between them will vary depending upon the volume resistivity of the insulating material that separates the conductors, that is, if a relatively lower-resistance insulator is used, this will result in a relatively higher leakage current. Thus, a designer of low-current probe cards will normally avoid the use of rubber-insulated single-core wires on a glass-epoxy board since rubber and glass-epoxy materials are known to be relatively low-resistance insulators through which relatively large leakage currents can flow.

One technique that has been used for suppressing inter-channel leakage currents is surrounding the inner core of each lead-in wire with a cylindrical "guard" conductor, which is maintained at nearly the same potential as the inner core by a feedback circuit in the output channel of the test instrument Because the voltage potentials of the outer guard conductor and the inner conductive core are made to substantially track each other, negligible leakage current will flow across the inner dielectric that separates these conductors regardless of whether the inner dielectric is made of a low- or high-resistivity material. Although leakage current can still flow between the guard conductors of the respective cables, this is typically not a problem because these guard conductors are connected to a low impedance path to ground. By using this guarding technique, significant improvement may be realized in the low-level current measuring capability of certain probe card designs.

To further improve low-current measurement capability, probe cards have been constructed so as to minimize leakage currents between the individual probing devices which mount the probing needles or other elements. With respect to these devices, higher-resistance insulating materials have been substituted for lower-resistance materials and additional conductive surfaces have been arranged about each device in order to perform a guarding function in relation thereto. In one type of assembly, for example, each probing device is constructed using a thin blade of ceramic material, which is a material known to have a relatively high volume resistivity. An elongate conductive trace is provided on one side of the blade to form the signal line and a backplane conductive surface is provided on the other side of the blade for guarding purposes. The probing element of this device is formed by a slender conductive needle, such as of tungsten, which extends in a cantilevered manner away from the signal trace. Such devices are commercially available, for example, from Cerprobe Corporation based in Tempe, Ariz. During assembly of the probe card, the ceramic blades are edge-mounted in radial arrangement about the opening in the card so that the needles terminate within the opening in a pattern suitable for probing the test device. The conductive backplane on each blade is connected to the guard conductor of the corresponding cable and also to corresponding conductive pad or "land" adjacent the opening in the probe card. In this manner each conductive path is guarded by the backplane conductor on the opposite side of the blade and by the conductive land beneath it.

It has been found, however, that even with the use of guarded cables and ceramic probing devices of the type just described, the level of undesired background current is still not sufficiently reduced as to match the capabilities of the latest generation of commercially available test instruments, which instruments are able to monitor currents down to one femtoamp or less.

In the latest generation of probe cards, efforts have been directed toward systematically eliminating low-resistance leakage paths within the probe card and toward designing extensive and elaborate guarding structures to surround the conductors along the signal path. For example, in one newer design, the entire glass-epoxy main board is replaced with a board of ceramic material, which material, as noted above, presents a relatively high resistance to leakage currents. In this same design, the lead-in wires are replaced by conductive signal traces formed directly on the main board, which traces extend from an outer edge of the main board to respective conductive pads that surround the board opening. Each pad, in turn, is connected to the signal path of a corresponding ceramic blade. In addition, a pair of guard traces are formed on either side of each signal trace so as to further isolate each trace against leakage currents.

In yet another of these newer designs, a main board of ceramic material is used having three-active layers to provide three dimensional guarding. Above this main board and connected thereto is a four-quadrant interface board that includes further guard structures. Between these two board assemblies is a third unit including a "pogo carousel." This pogo carousel uses pogo pins to form a plurality of signal lines that interconnect the interface board and the lower main board. It will be recognized that in respect to these pogo pins, the effort to replace lower resistance insulators with higher resistance insulators has been taken to its practical limit, that is, the insulator that would normally surround the inner conductor has been removed altogether.

From the foregoing examples, it will be seen that a basic concern in the art has been the suppression of inter-channel leakage currents. Using these newer designs, it is possible to measure currents down to nearly the femtoamp level. However, the ceramic material used in these newer designs is relatively more expensive than the glass-epoxy material it replaces. Another problem with ceramic materials is that they are relatively susceptible to the absorption of surface contaminants such as can be deposited by the skin during handling of the probe card. These contaminants can decrease the surface resistivity of the ceramic material to a sufficient extent as to produce a substantial increase in leakage current levels. In addition, the more extensive and elaborate guarding structures that are used in these newer designs has contributed to a large increase in design and assembly costs. Based on these developments it may be anticipated that only gradual improvements in the low-current measurement capability of the cards is likely to come about, which improvements, for example, will result from increasingly more elaborate guarding systems or from further research in the area of high resistance insulative materials.

In addition to suppressing leakage currents that flow between the different signal channels, low noise cables that reduce the triboelectric effect have been used on a probe card. In a guarded coaxial cable, triboelectric currents can arise between the guard conductor and the inner dielectric due to friction there between which causes free electrons to rub off the conductor and creates a charge buildup resulting in current flow.

It should also be noted that there are other factors unrelated to design that can influence whether or not the potential of a particular probe card for measuring low-level currents will be fully realized. For example, unless special care is taken in assembling the probe card, it is possible for surface contaminants, such as oils and salts from the skin or residues left by solder flux, to contaminate the surface of the card and to degrade its performance (due to their ionic character, such contaminants can produce undesirable electrochemical effects). Furthermore, even assuming that the card is designed and assembled properly, the card may not be suitably connected to the test instrument or the instrument may not be properly calibrated so as to completely null out, for example, the effects of voltage and current offsets. In addition, the probe card or the interconnecting lines, can serve as pickup sites for ac (alternating current) fields, which ac fields can be rectified by the input circuit of the test instrument so as to cause errors in the indicated dc values. Thus, it is necessary to employ proper shielding procedures in respect to the, probe card, the interconnecting lines and the test instrument in order to shield out these field disturbances. Due to these factors and others, when a new probe card design is being tested, it can be extremely difficult to isolate the causes of undesirable background current in the new design due to the numerous and possibly interacting factors that may be responsible.

A chuck typically includes an upper conductive surface in contact with the device under test. One or more additional layers are typically included below the upper conductive surface while being electrically isolated from one another. In this manner, the upper conductive surface may be electrically connected to the signal path, while the remaining layers may be electrically connected to the guard potential and shield potential, if desired. In addition, the chuck may be surrounded laterally with a conductive ring that may likewise be electrically connected to a guard or shield potential. In this manner, the device under test is guarded from below and to the side in order to reduce the electrical noise and leakage current that exists in the measurement of devices. Also, a plate may be suspended above the chuck (normally with an opening therein) and electrically interconnected to a guard or shield potential.

While such guarding and shielding reduces the amount of noise in the signal path, designers of such chucks must consider numerous other factors that influence the measurement. For example, thermal chucks (i.e., chucks that provide a range of temperatures) typically include heater circuits which emanate electrical signals into the region of the device under test, and hence the signal path. In addition, thermal chucks may include fluid paths, such as tubular cavities, within the chuck that carry hot or cold fluids that likewise result in noise in the signal path. Furthermore, thermal chucks are constructed of a variety of different materials, such as different conductive materials and different dielectric materials, all of which expand and contract at different rates further exasperating the potential of undesired noise in the test signal. Moreover, different temperatures change the relative humidity in the probe station, which in turn, change the amount of moisture absorbed by the dielectric materials, which in turn, change the impedance of the materials therein, and thus may result in variable leakage currents in the test signal.

With respect to thermal and non-thermal chucks there may be ground currents from the chuck to the test instrument that impact the sensed current in the signal path. During the probing of different parts of the device under test, the capacitive coupling (and magnetic coupling) of different portions of the chuck, and the capacitive coupling (and magnetic coupling) of the chuck relative to the enclosure changes, thereby inducing voltage changes. Furthermore, vibrations of the probe station itself, and thus the chuck located therein, as a result of testing, as a result of the external environment, and as a result of the air flowing within the probe station likewise induces undesirable leakage currents and noise in the signal path.

As it may be observed, due to these and other factors, when a new chuck design is being tested, it can be extremely difficult to isolate the causes of undesirable background current in the new design due to the numerous and possibly interacting factors that may be responsible.

To interconnect the chuck to the test instrumentation a service loop is normally used. The service loop is a flexible support that maintains all the hoses, the power cables, the signal cables, the instrumentation cables, and the sensor wiring, in a compact manner adjacent to one another while the chuck moves within the enclosure. The vibrations of the probe station, the vibrations from air blowing across the cables, the vibrations of the cables after moving the chuck, the vibrations from stepper motors connected to the chuck, the vibrations from flowing coolant in the hoses of the service loops, etc., all potentially results in undesirable currents in the signal path. In addition, magnetic and capacitive coupling between the power and ground conductors to the signal conductor likewise results in undesirable currents in the signal path. Further, the service loop itself is normally constructed of metal or otherwise includes metal bands, which likewise radiates electromagnetic signals that may result in undesirable currents in the signal path. All of these design considerations are in addition to considerations regarding the selection of construction materials and assembly considerations similar to those of probe cards.

As it may be observed, due to these factors, when a service loop design is being tested, it can be extremely difficult to isolate the causes of undesirable background current in the new design due to the numerous and possibly interacting factors that may be responsible.

The enclosure for the chuck, the service loop, the probe card, and the device under test likewise also includes potential sources of undesirable currents in the signal path. As an initial matter, the lid of the enclosure may have vibrational mechanical motion which results in a change in capacitance between the lid and the chuck, and a probe supported by the lid and the chuck, thus causing some undesirable currents in the signal path, in accordance with movement of the lid. In addition, there may be electrical surface charges on interior surfaces of the probe station, and other components contained therein, which also result in potentially undesirable currents in the signal path. Other structures within the enclosure can likewise result in undesirable currents in the signal path, such as for example, sliding plates below the chuck, conductive coated baffles below the chuck, air flow within the enclosure, motors for moving the chuck, position sensors, sensor wires, and dew meters. Furthermore, during testing of the device under test the probes themselves introduce external radiating signals into the probing environment in the vicinity of the device under test. All of these design considerations are in addition to considerations regarding the selection of construction materials and assembly considerations similar to those of probe cards.

In addition to those items contained within the enclosure of the probe station, there are additional sources of potential noise in the signal path located near the enclosure. The stage motors may be located adjacent the enclosure, power supplies may be adjacent the enclosure, stepper motor drivers may be located adjacent to the enclosure, personal computers may be located adjacent to the enclosure, computer monitors may be located adjacent to the enclosure, 60 hertz power sources may be located adjacent to the enclosure, etc., all of which may result in undesirable noise.

As it may be observed, due to these and other factors, when a probe station itself is being tested, it can be extremely difficult to isolate the causes of undesirable background current in the new design due to the numerous and possibly interacting factors that may be responsible.

As it may be observed, due to interrelated factors related to the chuck, the probing device, the probe card, the service loop, and other aspects of the probe station, when, the entire probe station itself is being tested, it can be extremely difficult to isolate the causes of undesirable background current in the new design due to the numerous and possibly interacting factors that may be responsible. Accordingly, with each design and with increasingly lower noise requirements, it is exceedingly difficult to determine the primary source of the noise in the signal path.

DETAILED DESCRIPTION OF THE PREFERRED EMBODIMENT

During the assembly process of probe stations many different aspects related to noise levels of the signals are measured. One of the tests that is performed on the tri-axial cabling is to measure the bulk resistance layer to layer, such as signal to guard and guard to shield. Another test that is performed on the tri-axial cabling is to provide a known voltage, such as 0 volts to 10 volts, and measure any current variations between the signal conductor (force path) and the guard conductor.

Figure 1:
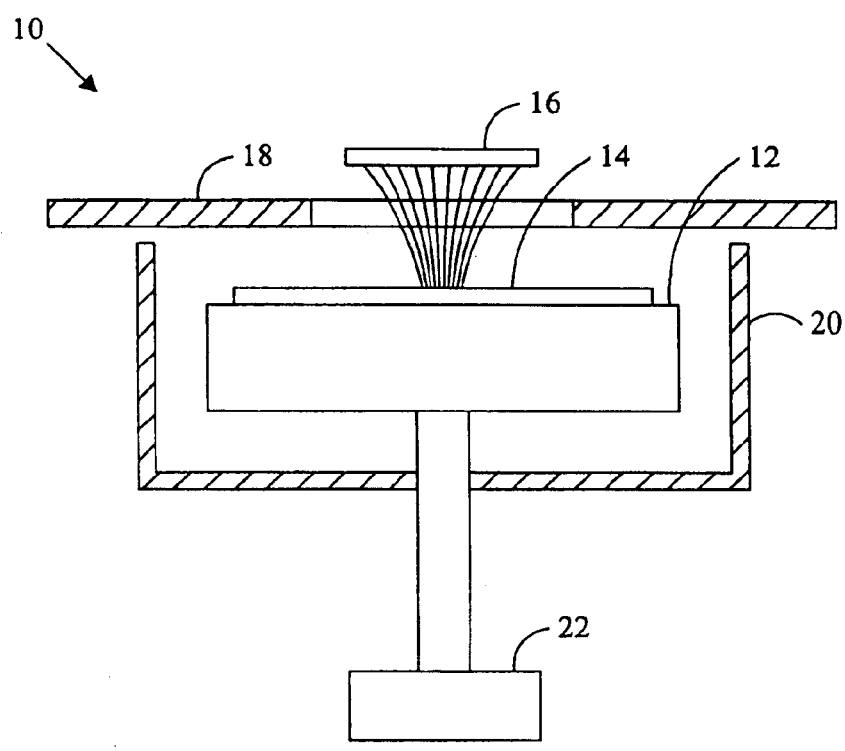
FIG. 1 illustrates an existing probe station
Figure 2:
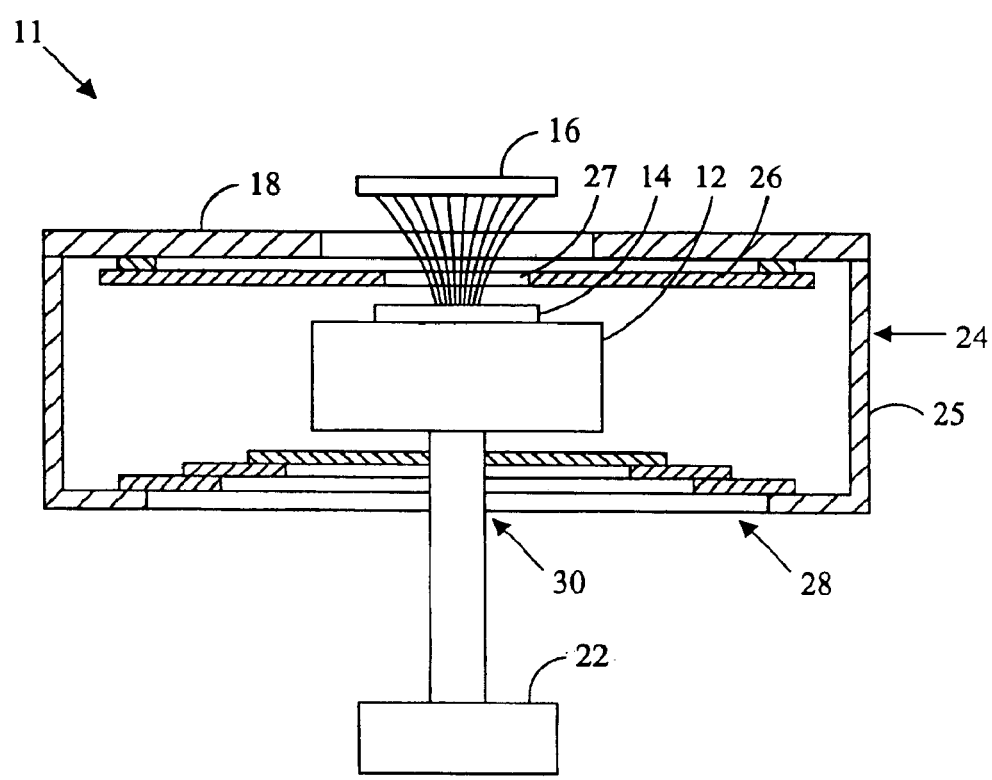
FIG. 2 illustrates another existing probe station
Figure 3:
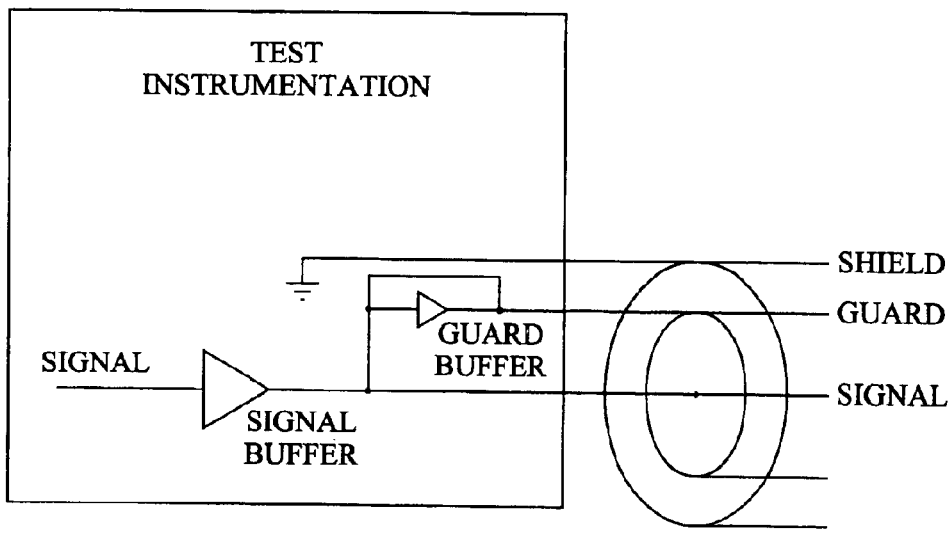
FIG. 3 illustrates a test instrument and associated buffers for a cable.

Referring to FIG. 3, the test instrumentation normally includes a signal buffer to drive the signal line. A guard unity gain amplifier connected to the output of the signal buffer provides a high impedance path between the signal and the guard together with imposing a signal on the guard conductor that tracks the signal on the signal conductor. While having the potential on the guard conductor exactly track the potential on the signal conductor is ideal, in actual test instrumentation there is a small delta voltage potential between the signal and guard while performing measurements. The potential on the guard conductor increases the effective leakage resistance between the signal conductor and shield conductor. For example, if the delta voltage was 0.10% difference then the leakage resistance between the signal conductor and the shield conductor would be approximately 1,000 times greater than it otherwise would have been. In effect the leakage resistance between signal and shield is increased 1,000 times, thus decreasing leakage currents. Similarly, the capacitance between the signal and shield is decreased by 1,000 times in comparison to not having a guard conductor.

When testing indicates leakage current problems with any particular tri-axial cable normally the connector to the cable was improperly connected or contaminants in the assembly process occurred. In addition, over time it is believed that the tri-axial cables deteriorate from contaminants from the insulation wrapped around the conductors, including for example, flux and tinning (tin oxide flaking).

Normally the shield material, which it is speculated by the present inventors may result in tinning, is a braided mesh material constructed of thin wires. To reduce the likelihood of tinning the present inventors considered the coverage provided by the shield and determined that a 10–15% gap exists between the wires. After consideration of this previously unconsidered gap in the shield material, the present inventors thought that by reducing the aperture between the wires that this would decrease the likelihood that electromagnetic waves exterior to the cable itself would be able to penetrate between the wires to the guard layer underneath. In addition, the mesh of small long wires tend to have a significant resistance, such as 1 ohm or more. To reduce the resistance of the braid the present inventors further considered using thicker gage wires, which would likely result in large openings that is counter to the goal of decreasing the opening side, or otherwise using one or more large wires to act as low resistance paths, while would likely result in a significantly more expensive cable. In addition, the present inventors considered increasing the distance between the guard and shield conductors to decrease any potential capacitive coupling. To reduce the likelihood that signals will pass through the openings in the mesh, the present inventors added an additional layer of conductive material between the shield material and the adjacent dielectric layer which covers in excess of 95% of the dielectric layer, and covers substantially 100% in combination with the shield material, in profile.

To test the new cable design, the present inventors put the cable in a metal cylinder and imposed a strong radio frequency signal onto the conductive cylinder while measuring any induced noise on the signal conductor. The measurement of the noise levels involves connecting the cable to the test instrumentation and positioning the cable in a desirable location. It would be expected that the noise level would decrease significantly as a result of the additional conductive material, but in utter surprise to the present inventors the noise level in fact did not noticeably change, apart from a decrease in the capacitive coupling because of the increased distance between the shield conductor and the signal conductor. Accordingly, it was initially considered that modification of the cable to include an additional conductive layer adjacent the shield to reduce the potential for electromagnetic signals to pass through was of no perceived value.

While conducting such noise tests the present inventors observed a phenomena not commonly associated with such measurement characteristics, namely, that the settling time of the current signals within the modified cables were reduced in comparison to non-modified cables. In addition, the settling time of the cables is not normally a characterized parameter of the cable so accordingly noticing the difference required an astute, and generally overlooked, observation on the part of the present inventors. Based upon these realizations, the present inventors constructed a further test that involved comparing whether the modified cables were less sensitive to table (surface) vibrations than non-modified cables. The present inventors were surprised to determine that in fact the noise level in the modified cables when laid on the table outside of the conductive tubular member were in fact less than the non-modified cables. After coming to this rather unexpected realization, the present inventors then reconsidered the structure of the modified cables and came to the realization that the vibrational motion of the table, albeit rather small, was a source of the noise levels observed in the cables. With this realization of vibrational motion in the tri-axial cables being identified as a principal source of noise, the present inventors then realized that non-negligible triboelectric currents were in fact being generated between the shield conductive layer and the adjacent dielectric layer, and thereafter impacting signal integrity within the signal conductor.

This unlikely source of noise generation came as an utter astonishment to the present inventors because the guard buffer amplifier within the test instrumentation is driving the potential of the guard conductor to that of the signal conductor, and thus presumably counteracting any external influences. However, apparently the guard amplifier in the test instrumentation has non-ideal characteristics such that small external changes are not effectively eliminated, or otherwise the guard conductor does not have ideal characteristics. In any event, even in a shielded environment it was determined that a significant source of noise is charge that builds up on the layers between the guard conductor and the shield conductor, principally as a result of relative movement of these layers. The capacitive charge buildup, typically referred to as triboelectric currents, couples from the layer or layers external to the guard conductor to the signal conductor, and are observed as noise.

For example, a test of the decay of such triboelectric currents for the non-modified cables illustrates a decay time of approximately 15–30 seconds to 10% of its initial value. In contrast, a test of the decay of such triboelectric currents for the modified cables exhibits a decay time of approximately 1–5 seconds to 10% of its initial value.

One way, albeit not the only way or a necessary characteristic, to characterize the difference is that the modified cable has a settling time of at least three times as fast as the non-modified cable.

The low-noise cables include conductive and dielectric layers in coaxial arrangement with each other and further include at least one layer of material between the guard and the shield within each cable adapted for suppressing the triboelectric effect so as to minimize any undesirable currents that would otherwise be generated internally in each cable due to this effect. This layer of material together with certain other structures included in the probe station enables probing using ultra-low currents of less than one femtoamp.

Figure 4:
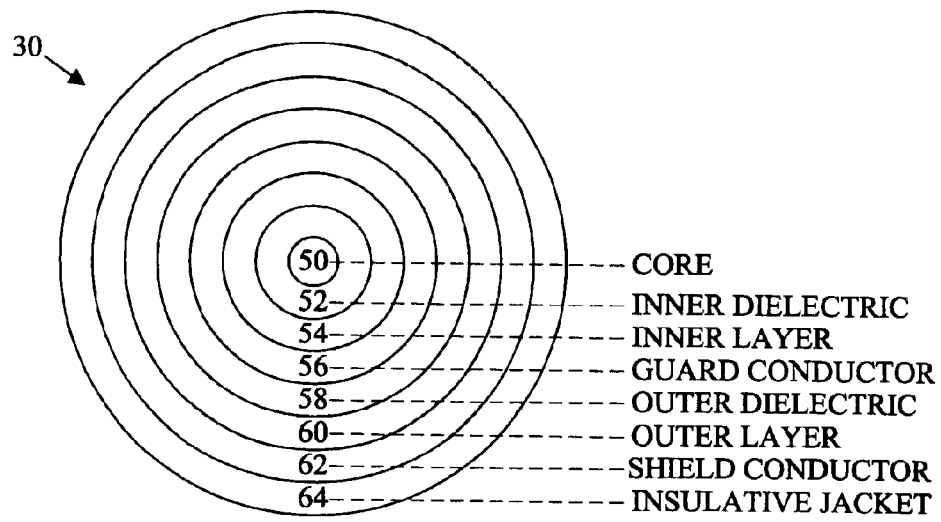
FIG. 4 illustrates a tri-axial cable.

FIG. 4 shows a transverse sectional view through an exemplary cable 30. This portion, which is of tri-axial construction, includes an inner conductor or core 50, an inner dielectric 52, an inner layer 54, a guard conductor 56, an outer dielectric 58, an outer layer 60, a shield conductor 62, and an insulative jacket 64. The inner layer 54, and outer layer 60 are of suitable composition for reducing triboelectric current generation between the inner dielectric 52 and the guard conductor 56, and the outer dielectric 58, and the shield conductor 62, respectively, to less than that which would occur were the inner dielectric 52 and the guard conductor 56, and the outer dielectric 58, and the shield conductor 62, respectively, to directly adjoin each other. The inner layer 54 and outer layer 60 should have physical properties similar to that of the inner dielectric 52 so that it does not rub excessively against the inner dielectric 52 and outer dielectric 58, respectively, despite cable flexing or temperature changes. At the same time, the inner layer 54 and outer layer 60 should have sufficient conductive properties to dissipate any charge imbalances that may arise due to any free electrons that have rubbed off the guard conductor 56 or shield conductor 62, respectively. A suitable material for this purpose is a fluoropolymer such as TEFLON (TM) or other insulative material such as polyvinylchloride or polyethylene in combination with graphite or other sufficiently conductive additive. In addition, a sputtering technique may be used to apply a suitable triboelectric noise reducing layer. Also, the shield and guard conductors may be impregnated in some manner with triboelectric reducing material.

Figure 5:
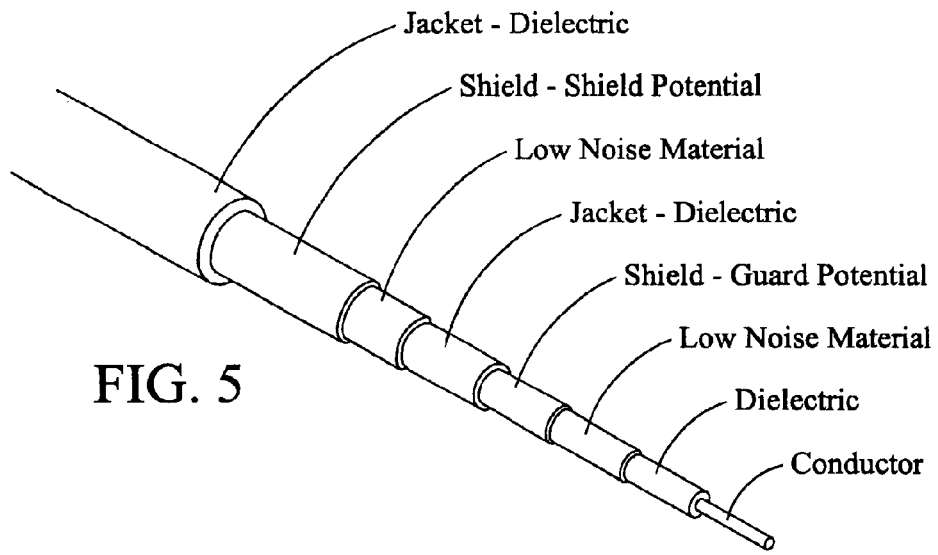
FIG. 5 illustrates the tri-axial cable of FIG. 4.
Figure 6:
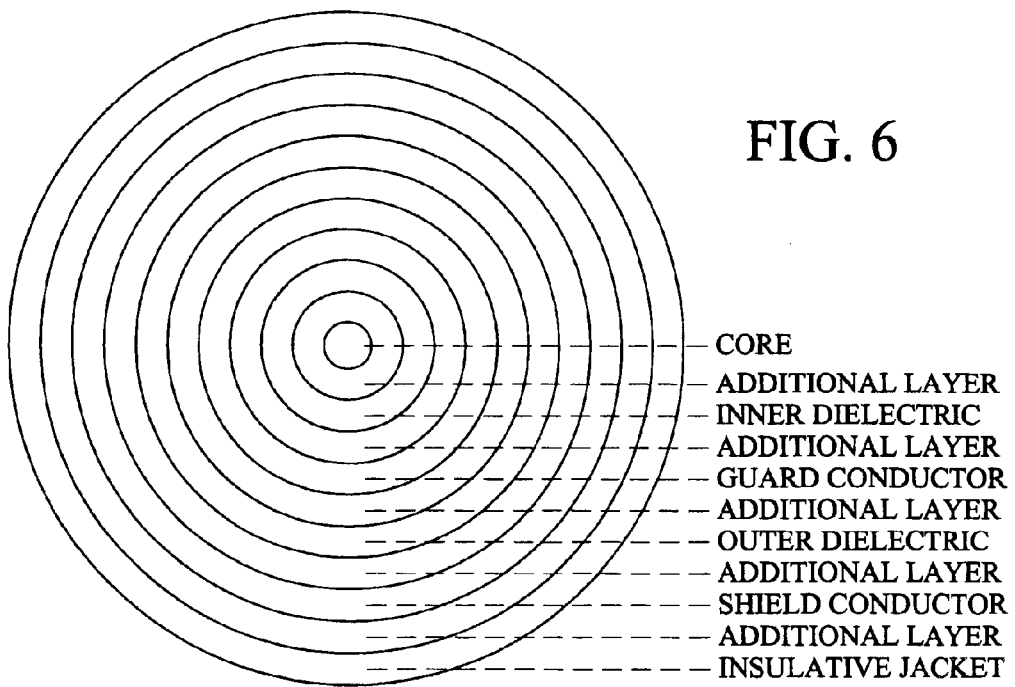
FIG. 6 illustrates another tri-axial cable.

An exemplary cable is illustrated in FIG. 5. It is to be understood that additional layers may likewise be included with the cable. Another exemplary cable is illustrated in FIG. 6, that includes additional layers of triboelectric reducing materials, where any one or more of the triboelectric reducing layers may be included.

It is to be understood that the inner layer 54 may be omitted, if desired. In addition it is to be understood that the cable described herein, with the outer layer, or the combination of the outer layer and the inner layer, may be used for other applications apart from probe stations. For example, such cables may be suitable for medical devices.

In accordance with the previous discussion, the present inventors have discovered that the primary problem, at least at some stage in the design, is not how best to suppress the leakage currents that flow between the different signal channels but rather how best to suppress those currents that internally arise in each cable or signal channel as a result of the triboelectric effect. In a tri-axial cable, triboelectric currents can arise between the shield conductor and the outer dielectric due to friction there between which causes free electrons to rub off the conductor and creates a charge imbalance that causes current to flow. Such triboelectric currents are likewise generated at other interfaces. Once the inventor recognized that this triboelectric effect might be the critical problem, he proceeded to test this insight by testing such "low-noise" cables. It will be noted that the present inventors do not claim to have discovered a new solution to the problem of the triboelectric effect. A relatively straightforward solution to this problem can be found in the field of cable technology wherein it is known how to construct a "flow-noise" cable by using an additional layer of material between a guard conductor and an inner dielectric, which material is of suitable composition for suppressing the triboelectric effect. This layer, in particular, includes a nonmetallic portion that is physically compatible with the inner dielectric so as to be prevented from rubbing excessively against this dielectric and, on the other hand, includes a portion that is sufficiently conductive that it will immediately dissipate any charge imbalance that may be created by free electrons that have rubbed off the outer conductor. It is not claimed by the present inventors that this particular solution to the triboelectric effect problem is his invention. Rather it is the recognition that this specific problem is a major source of performance degradation in the field of low-current design and the recognition of the interfaces where such currents may originate.

In retrospect, one can speculate as to why the significance of the triboelectric effect was not recognized sooner by investigators in the art of probe station design. One possible reason is that verifying the importance of this effect is not merely a matter of replacing cables with low-noise cables. Because of the non-design related factors specified in the background section, one of ordinary skill who assembled and then tested a probe station that included tri-axial low-noise cables would not necessarily detect the superior capability of this cable for low current measurements. For example, surface contaminants deposited during assembly might raise the background level of current to a sufficient extent that the effect of the low-noise cables is concealed. To this it may be added that the direction taken in the art of probe station design, where the focus has been on the problem of suppressing inter-channel leakage currents.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A probe station for probing a device under test comprising:
   (a) a support for holding said device under test;
   (b) a probing device for testing said device under test while being supported by said support;
   (c) a cable connecting said probing device to a test instrument, said cable including:
      (i) a first conductor, a first dielectric, and a second conductor, where said first dielectric is between said first conductor and said second conductor;
      (ii) a second dielectric, and a third conductor, where said second dielectric is between said second conductor and said third conductor;
      (iii) further including a first layer of material between said second dielectric and said third conductor of suitable composition for reducing triboelectric current generation between said second dielectric and said third conductor to less than that which would occur were said second dielectric and said third conductor to directly adjoin each other.

2. The probe station of claim 1 further comprising a second layer of material between said first dielectric and said second conductor of suitable composition for reducing triboelectric current generation between said first dielectric and said second conductor to less than that which would occur were said first dielectric and said second conductor to directly adjoin each other.

3. A probe station for probing a device under test comprising:
   (a) a support for holding said device under test;
   (b) a probing device for testing said device under test while being supported by said support;
   (c) a cable connecting said probing device to a test instrument, said cable including:
      (i) a first conductor, a first dielectric, and a second conductor, where said first dielectric is between said first conductor and said second conductor;
      (ii) a second dielectric, and a third conductor, where said second dielectric is between said second conductor and said third conductor;
      (iii) further including a first layer of material between said second dielectric and said second conductor of suitable composition for reducing triboelectric current generation between said second dielectric and said second conductor to less than that which would occur were said second dielectric and said second conductor to directly adjoin each other.

4. The probe station of claim 3 further comprising a second layer of material between said first dielectric and said second conductor of suitable composition for reducing triboelectric current generation between said first dielectric and said second conductor to less than that which would occur were said first dielectric and said second conductor to directly adjoin each other.

5. A probe station for probing a device under test comprising:
   (a) a support for holding said device under test;
   (b) a probing device for testing said device under test while being supported by said support;
   (c) a cable connecting said probing device to a test instrument, said cable including:
      (i) a first conductor, a first dielectric, and a second conductor, where said first dielectric is between said first conductor and said second conductor;
      (ii) a second dielectric, and a third conductor, where said second dielectric is between said second conductor and said third conductor;
      (iii) further including a first layer of material between said first dielectric and said first conductor of suitable composition for reducing triboelectric current generation between said first dielectric and said first conductor to less than that which would occur were said first dielectric and said first conductor to directly adjoin each other.

6. The probe station of claim 5 further comprising a second layer of material between said first dielectric and said second conductor of suitable composition for reducing triboelectric current generation between said first dielectric and said second conductor to less than that which would occur were said first dielectric and said second conductor to directly adjoin each other.

7. A cable comprising
   (a) a first conductor, a first dielectric, and a second conductor, where said first dielectric is between said first conductor and said second conductor;
   (b) a second dielectric, and a third conductor, where said second dielectric is between said second conductor and said third conductor;
   (c) further including a first layer of material between said second dielectric and said third conductor of suitable composition for reducing triboelectric current generation between said second dielectric and said third conductor to less than that which would occur were said second dielectric and said third conductor to directly adjoin each other.

8. The cable of claim 7 further comprising a second layer of material between said first dielectric and said second conductor of suitable composition for reducing triboelectric current generation between said first dielectric and said second conductor to less than that which would occur were said first dielectric and said second conductor to directly adjoin each other.

9. A cable comprising:
   (a) a first conductor, a first dielectric; and a second conductor, where said first dielectric is between said first conductor and said second conductor;
   (b) a second dielectric, and a third conductor, where said second dielectric is between said second conductor and said third conductor,
   (c) further including a first layer of material between said second dielectric and said second conductor of suitable composition for reducing triboelectric current generation between said second dielectric and said second conductor to less than that which would occur were said second dielectric and said second conductor to directly adjoin each other.

10. The cable of claim 9 further comprising a second layer of material between said first dielectric and said second conductor of suitable composition for reducing triboelectric current generation between said first dielectric and said second conductor to less than that which would occur were said first dielectric and said second conductor to directly adjoin each other.

11. A cable comprising:
 (a) a first conductor, a first dielectric, and a second conductor, where said first dielectric is between said first conductor and said second conductor;
 (b) a second dielectric, and a third conductor, where said second dielectric is between said second conductor and said third conductor;
 (c) further including a first layer of material between said first dielectric and said first conductor of suitable composition for reducing triboelectric current generation between said first dielectric and said first conductor to less than that which would occur were said first dielectric and said first conductor to directly adjoin each other.

12. The probe station of claim 11 further comprising a second layer of material between said first dielectric and said second conductor of suitable composition for reducing triboelectric current generation between said first dielectric and said second conductor to less than that which would occur were said first dielectric and said second conductor to directly adjoin each other.

* * * * *

UNITED STATES PATENT AND TRADEMARK OFFICE
CERTIFICATE OF CORRECTION

PATENT NO. : 6,847,219 B1
DATED : January 25, 2005
INVENTOR(S) : Timothy Lesher et al.

It is certified that error appears in the above-identified patent and that said Letters Patent is hereby corrected as shown below:

Column 8,
Line 22, change "gage wires" to -- gauge wires --.

Column 9,
Line 30, change "triboclectric" to -- triboelectric --.

Column 10,
Line 44, change "flow noise" to -- low noise --.

Signed and Sealed this

Twentieth Day of December, 2005

JON W. DUDAS
*Director of the United States Patent and Trademark Office*